US005777381A

United States Patent [19]
Nishida

[11] Patent Number: 5,777,381
[45] Date of Patent: Jul. 7, 1998

[54] SEMICONDUCTOR DEVICES METHOD OF CONNECTING SEMICONDUCTOR DEVICES AND SEMICONDUCTOR DEVICE CONNECTORS

[75] Inventor: Toru Nishida, Kobe, Japan

[73] Assignee: Nissin Co., Ltd., Takarazuka, Japan

[21] Appl. No.: 671,371

[22] Filed: Jun. 27, 1996

[30] Foreign Application Priority Data

Apr. 15, 1996 [JP] Japan ................................. 8-118278

[51] Int. Cl.[6] .................................................. H01L 23/48
[52] U.S. Cl. ............................................ 257/693; 257/685
[58] Field of Search .............................. 257/679, 685, 257/686, 690, 691, 692, 693, 698, 776, 784, 723; 438/108, 125

[56] References Cited

U.S. PATENT DOCUMENTS 5,241,456  8/1993  Marcinkiewicz et al. ............. 257/685
5,452,182  9/1995  Eichelberger et al. .

Primary Examiner—Mahshid D. Saadat
Assistant Examiner—S. V. Clark
Attorney, Agent, or Firm—Nikaido, Marmelstein, Murray & Oram LLP

[57] ABSTRACT

Semiconductor devices suited for high-density packaging, a method of connecting such semiconductor devices, and connectors for connecting such semiconductor devices. Each semiconductor device 10 includes a plurality of exposed terminals 13 arranged two-dimensionally on opposite surfaces thereof. Each connector 30 includes a plurality of connecting pins projecting from opposite surfaces thereof and arranged two-dimensionally in a corresponding relationship to the exposed terminals 13. Each end connector 33 includes connecting pins 34 likewise arranged two-dimensionally on an inward surface thereof. These connectors 30 and 33 are used to sandwich a plurality of semiconductor devices 10 to form a package. The exposed terminals 13 of the semiconductor devices 10 are electrically connected through the connecting pins of the connectors 30 and 33.

13 Claims, 15 Drawing Sheets

SEMICONDUCTOR DEVICES METHOD OF CONNECTING SEMICONDUCTOR DEVICES AND SEMICONDUCTOR DEVICE CONNECTORS

BACKGROUND OF THE INVENTION

1. Field of the Invention

This invention relates to semiconductor devices with semiconductor elements enclosed in packages, methods of electrically connecting such semiconductor devices, and semiconductor device connectors. In particular, the invention relates to a technique of packaging semiconductor devices in high density.

2. Description of the Related Art

The development of semiconductor devices has brought about significant increases in the number of terminals (or pins) for external connection. In line with this trend, there exist today multi-terminal semiconductor devices of the types known as QFP (Quad Flat Package) and BGA (Ball Grid Array).

In QFP, as shown in FIG. 1, a package 201 has a semiconductor element 202 enclosed therein, and numerous lead terminals 203 extending from all sides of the package 201 for connection to an external. The QFP is mounted on a carrier board 204 with the lead terminals 203 soldered to wiring patterns 205.

In BGA, as shown in FIG. 2, a package 211 has a semiconductor element 212 enclosed therein, and numerous solder balls 213 arranged two-dimensionally on a back side surface of the package 211 for connection to an external. The BGA is mounted on a carrier board 214 with the solder balls 213 reflow-soldered to wiring patterns 215.

However, both QFP and BGA, because each package is mounted in horizontal posture on the surface of the carrier board, have the disadvantage that each semiconductor device occupies a large area of the board. Further, long wiring is required between adjacent semiconductor devices for the same reason. Bus lines are often used to interconnect corresponding terminals of the semiconductor devices. In such a case, a large number of wires longer than one side of each package are required. Long wiring results in marked influences of stray capacitance and parasitic inductance which hamper high-speed processing.

SUMMARY OF THE INVENTION

This invention has been made having regard to the state of the art noted above, and has for a primary object to provide semiconductor devices suited for high-density packaging and for shortening wiring between the semiconductor devices.

Another object of this invention is to provide a method of connecting such semiconductor devices.

A further object of this invention is to provide connectors for connecting such semiconductor devices.

The above primary object is fulfilled, according to this invention, by a semiconductor device comprising:

a package for enclosing at least one semiconductor element;

a plurality of exposed terminals for external connection arranged two-dimensionally on each of opposite surfaces of the package; and internal wiring for interconnecting the semiconductor element and the exposed terminals for external connection on the opposite surfaces of the package.

Semiconductor devices according to this invention are assembled three-dimensionally by arranging the devices such that front side surfaces or rear side surfaces of the packages defining the exposed terminals for external connection are in an opposed relationship. The exposed terminals in the opposed relationship of adjacent semiconductor devices are connected to each other. When a plurality of semiconductor devices are mounted on a carrier board. An area of the board occupied by these semiconductor devices corresponds to an installation area where the semiconductor devices assembled three-dimensionally contact the carrier board. This area occupied by the semiconductor devices is far smaller than an area occupied by conventional QFP or BGA devices mounted in horizontal posture on a carrier board. Further, where the exposed terminals of adjacent semiconductor devices are opposed to each other with a small spacing therebetween, only short wirings are required to interconnect the exposed terminals. This provides the advantage of diminishing stray capacitance and parasitic inductance of wirings which hamper high-speed processing.

Preferably, the package includes package bases defining the opposite surfaces thereof, respectively, the exposed terminals for external connection being formed on outer surfaces of the package bases, the semiconductor element being die-bonded to an inner surface of at least one of the package bases. This construction facilitates fabrication of the semiconductor devices each having exposed terminals arranged on the opposite surfaces of the package.

A sealing synthetic resin may be filled into a space between the package bases to secure reliability of the semiconductor device.

Preferably, the package bases are electrically interconnected through a flexible printed circuit board defining a plurality of wiring patterns, the wiring patterns being connected at first ends thereof to internal terminals formed on an inner surface of one of the package bases, and at second ends thereof to internal terminals formed on an inner surface of the other of the package bases. This construction facilitates electrical connection between the two package bases.

This invention also provides a method of electrically connecting a plurality of semiconductor devices each having at least one semiconductor element enclosed in a package, a plurality of exposed terminals for external connection arranged two-dimensionally on each of opposite surfaces of the package, and internal wiring for interconnecting the semiconductor element and the exposed terminals for external connection on the opposite surfaces of the package, the method comprising:

arranging the semiconductor devices at fixed intervals with the exposed terminals of one semiconductor device opposed to the exposed terminals of another semiconductor device; and interposing conductive connecting elements between an adjacent pair of the semiconductor devices, to interconnect the exposed terminals of one semiconductor device and the exposed terminals of another semiconductor device, thereby to electrically connect the semiconductor devices.

With the method of connecting semiconductor devices according to this invention, the semiconductor devices are arranged in an opposed relationship and at fixed intervals, with the conductive connecting elements interposed between an adjacent pair of the semiconductor devices to interconnect the exposed terminals of one semiconductor device and the exposed terminals of another semiconductor device. The semiconductor devices assembled in this way occupy only a very small area of a carrier board. Where an adjacent pair of semiconductor devices are arranged close to each other, the conductive connecting elements may have a minimal length for interconnecting the exposed terminals of the two semiconductor devices.

In the method according to this invention, the conductive connecting elements may, for example, be connecting pins having opposite ends thereof elastically contacting the exposed terminals opposed to each other. Alternatively, the conductive connecting elements may be connecting pins having opposite ends thereof joined by a joining material to the exposed terminals opposed to each other.

In a further aspect of this invention, there is provided a connector assembly for electrically connecting a plurality of semiconductor devices each having at least one semiconductor element enclosed in a package, a plurality of exposed terminals for external connection arranged two-dimensionally on each of opposite surfaces of the package, and internal wiring for interconnecting the semiconductor element and the exposed terminals for external connection on the opposite surfaces of the package. The connector assembly comprises a plurality of connectors each including:

a base plate; and conductive connecting elements arranged two-dimensionally on the base plate in a corresponding relationship to the exposed terminals, the conductive connecting elements extending through the base plate and projecting from opposite surfaces thereof.

According to this invention, each connector is interposed between an adjacent pair of semiconductor devices. The base plate has conductive connecting elements in the same arrangement as the exposed terminals of the semiconductor devices. The conductive connecting elements extend through the base plate to project from the opposite surfaces thereof. The exposed terminals of an adjacent pair of semiconductor devices are electrically interconnected through the conductive connecting elements of the connector.

The semiconductor devices may be assembled in high density by interposing therebetween the connector according to this invention. The conductive connecting elements for electrically interconnecting the exposed terminals of adjacent semiconductor devices may have a minimal length to minimize the influences of stray capacitance and parasitic inductance of wirings (connecting elements) which hamper high-speed processing of the semiconductor devices.

Preferably, the base plate includes a positioning structure for positioning the semiconductor devices such that the exposed terminals register with the conductive connecting elements. This construction facilitates a positional adjustment between the exposed terminals of the semiconductor devices and the conductive connecting elements of the connector.

Preferably, the base plate includes external connection terminals arranged on at least one side surface thereof. When the semiconductor devices are mounted on a carrier board by means of the connector assembly, the external connection terminals may be used to facilitate connection to the wiring patterns on the carrier board.

The conductive connecting elements may, for example, be axially elastic connecting pins having opposite ends thereof elastically contacting the exposed terminals of the semiconductor devices opposed to each other. According to this construction, the connectors and semiconductor devices are only in elastic contact with each other. Any semiconductor device failing to function properly after mounting on a carrier board may be replaced with ease.

Preferably, the connector assembly further comprises a coupling structure for rigidly coupling the base plates arranged in a direction of thickness thereof, with the semiconductor devices interposed therebetween. This coupling structure assures the elastic contact between the elastic connecting pins and the exposed terminals of the semiconductor devices. Any semiconductor device may be replaced with ease by undoing the coupling structure.

Preferably, each of the elastic connecting pins includes a conductive tube opening at opposite ends thereof, a pair of conductive contacts disposed in opposite end regions of the tube to be movable longitudinally thereof, the contacts being retained in the tube with only tip ends of the contacts projectable from the opposite ends, respectively, and a biasing element mounted in the tube for biasing the contacts in directions to project the tip ends from the opposite ends.

The conductive connecting elements may be connecting pins in form of metal rods having opposite ends thereof joined through a joining material to the exposed terminals of the semiconductor devices opposed to each other. Such a connector has a simplified construction, and yet assures the electrical connection between semiconductor device and connector.

Preferably, the connecting pins in form of metal rods have solder balls formed at opposite ends thereof. Such solder balls may be formed easily by electroplating. This involves a less chance of adversely affecting the semiconductor devices than where solder balls are formed by electroplating on the exposed terminals of the semiconductor devices.

The conductive connecting elements may be through hole platings formed by plating a metal in bores of the base plate. In this case, the through hole platings have opposite ends thereof joined through a joining material to the exposed terminals of the semiconductor devices opposed to each other.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DETAILED DESCRIPTION OF THE PREFERRED EMBODIMENTS

Semiconductor devices, a method of connecting the semiconductor devices, and semiconductor device connectors in preferred embodiments of this invention will be described hereinafter with reference to the drawings.

A semiconductor device according to this invention will be described first.

Figure 1:
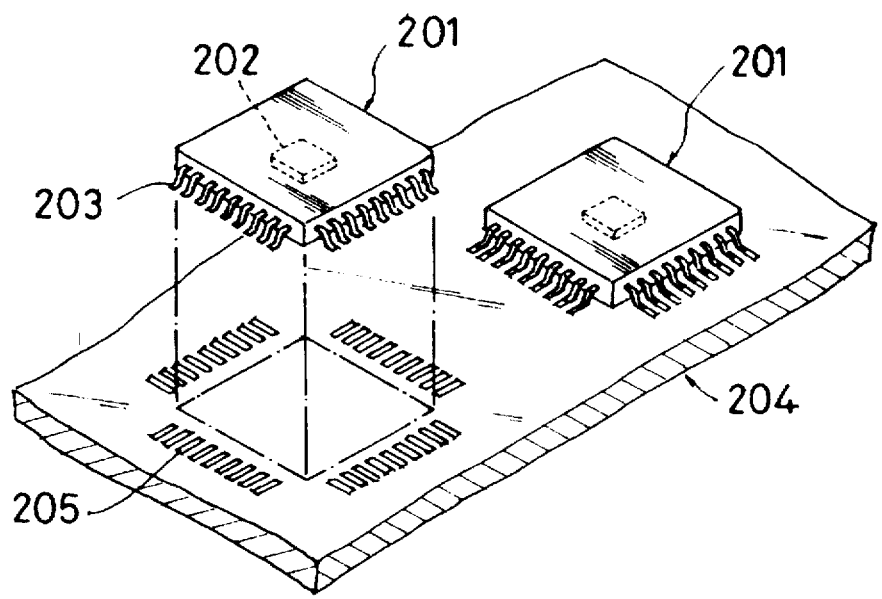
FIG. 1 is a perspective view showing one example of conventional semiconductor devices.
Figure 2:
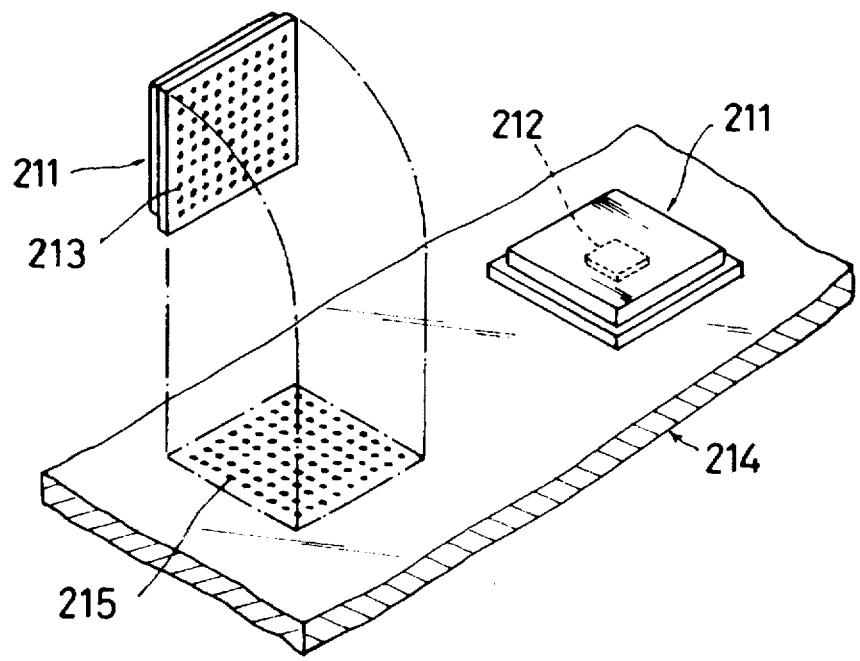
FIG. 2 is a perspective view showing another example of conventional semiconductor devices.
Figure 3:
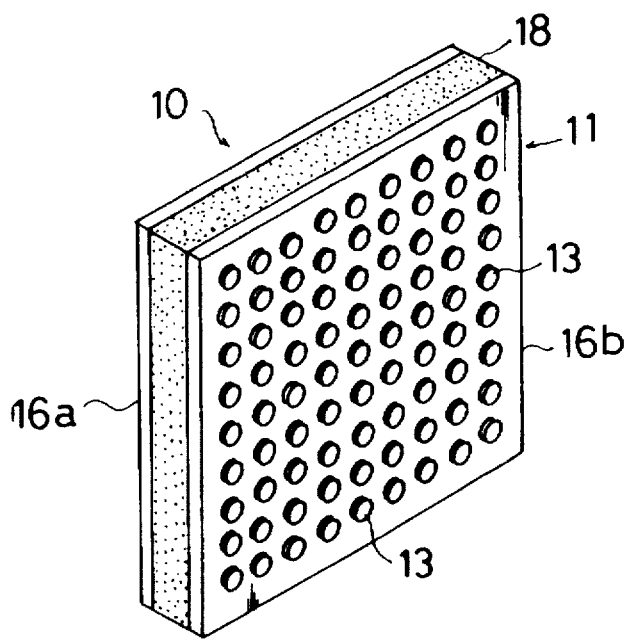
FIG. 3 is a perspective view showing an outward appearance of a semiconductor device embodying this invention.
Figure 4:
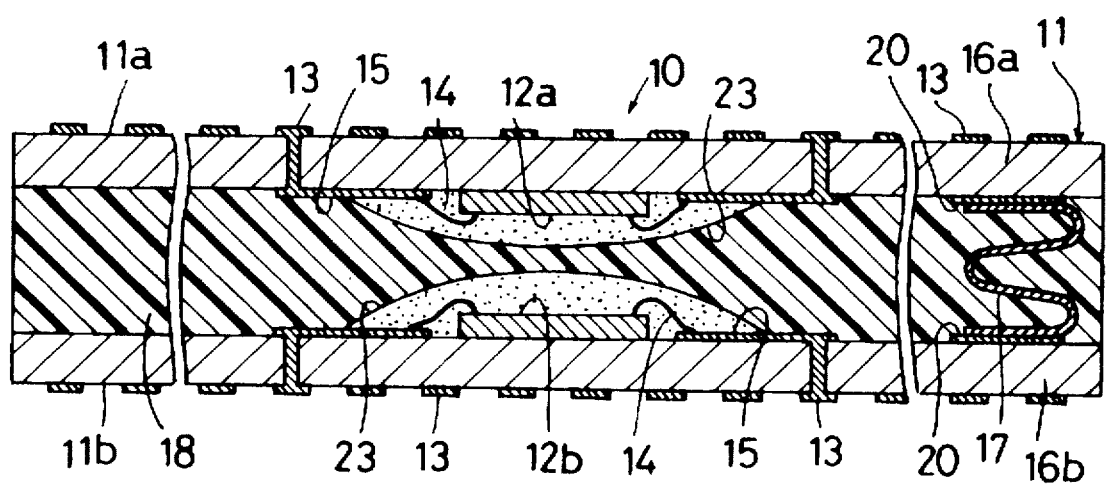
FIG. 4 is a sectional view of the semiconductor device embodying this invention.

FIG. 3 is a perspective view showing an outward appearance of a semiconductor device embodying this invention. FIG. 4 is a sectional view of the semiconductor device shown in FIG. 3.

Referring to FIGS. 3 and 4, a semiconductor device 10 according to this invention has a rectangular package 11. The package 11 is about 10 to 50 mm long in one side, and about 2 to 8 mm thick. The package 11 is not limited to the rectangular shape but may be disk-shaped, for example. The package 11 encloses at least one semiconductor element. In this embodiment, two semiconductor elements 12a and 12b are enclosed therein. The package 11 includes a plurality of exposed terminals 13 for connection to an external, arranged two-dimensionally on a front side surface 11a and a back side surface 11b thereof. The exposed terminals 13 are about 0.3 to 1.2 mm in diameter, and are arranged at intervals of about 0.5 to 1.5 mm. The semiconductor elements 12a and 12b and the exposed terminals 13 on opposite surfaces 11a and 11b of package 11 are interconnected through internal wiring such as fine metal lines 14 and multi-layer wiring patterns 15.

The semiconductor device 10 in this embodiment includes package bases 16a and 16b defining the opposite surfaces 11a and 11b of package 11. The package bases 16a and 16b are formed of ceramic, an epoxy resin or the like. The exposed terminals 13 are formed on outer surfaces of the package bases 16a and 16b (i.e. the opposite surfaces 11a and 11b of package 11). The semiconductor elements 12a and 12b are die-bonded by a conductive epoxy resin or the like to inner surfaces of the package bases 16a and 16b, respectively. The package bases 16a and 16b are interconnected inside the package 11 through a flexible printed circuit board 17. A space between the package bases 16a and 16b is filled with an insulating epoxy resin 18, for example.

A process of manufacturing the semiconductor device 10 shown in FIGS. 3 and 4 will be described next.

Figure 5:
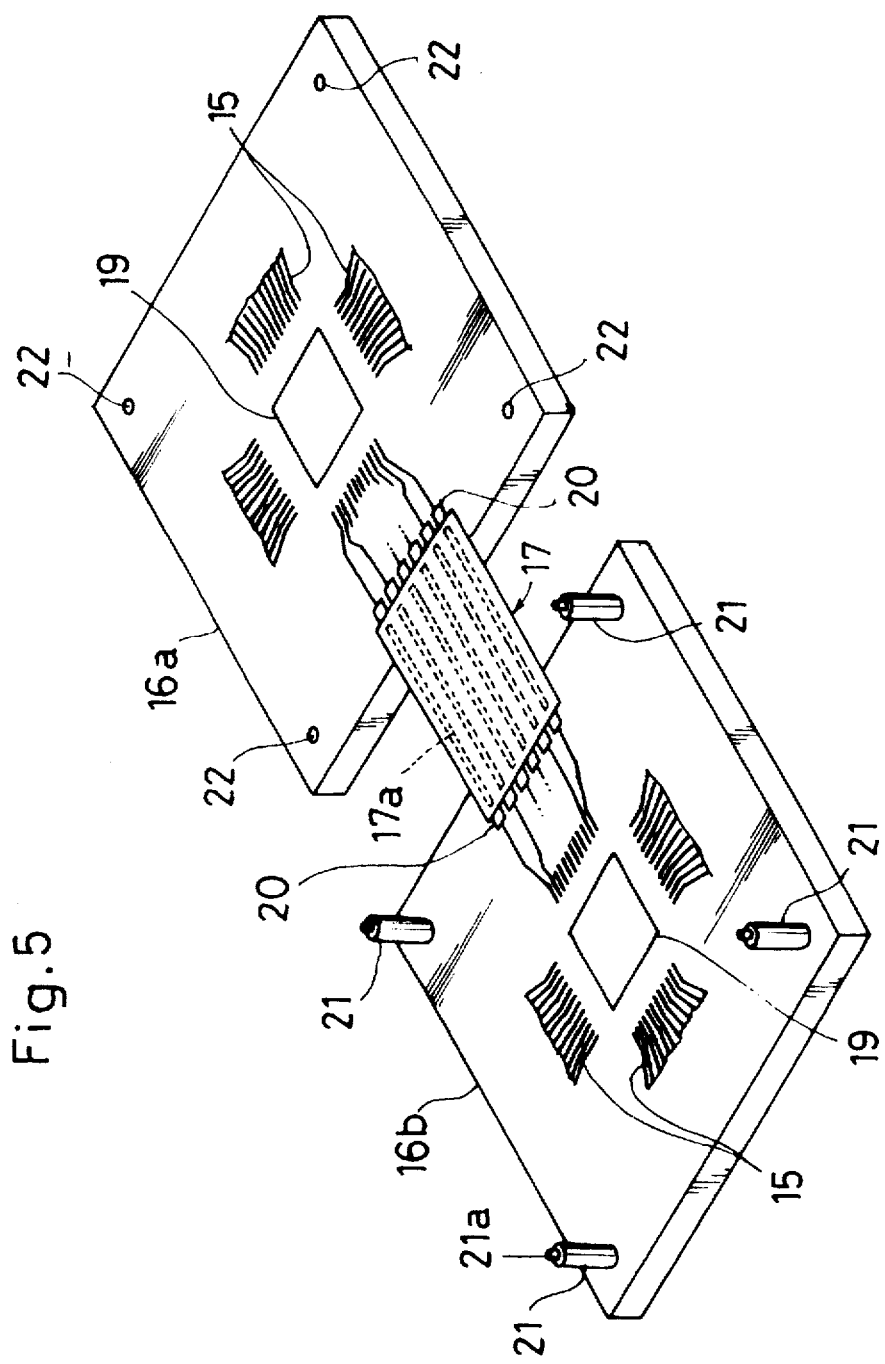
FIG. 5 is a perspective view of package bases used with the semiconductor device.

As shown in FIG. 5, package bases 16a and 16b defining through holes and multi-layer wiring are prepared. The exposed terminals 13 are already formed on the outer surfaces (back side surfaces in FIG. 5) of the package bases 16a and 16b. The package bases 16a and 16b define die pads 19 centrally of the inner surfaces thereof, respectively, for die-bonding the semiconductor elements 12a and 12b. Ends of a plurality of wiring patterns 15 are arranged around each die pad 19. The other ends of wiring patterns 15 are connected to the exposed terminals 13 through the multi-layer wiring and through holes formed in the package bases 16a and 16b. Part of the other ends are connected to internal connection terminals 20 formed on the inner surface adjacent one side of each package base 16a or 16b. The flexible printed circuit board 17 defining wiring patterns 17a extends between the internal connection terminals 20 of the two package bases 16a and 16b.

The package base 16b includes pins 21 erected at the four corners of the inner surface thereof. Each pin 21 has a projection 21a formed at a free end thereof. On the other hand, the package base 16a defines holes 22 at the four corners of the inner surface thereof for fitting tight with the projections 21a.

Figure 6:
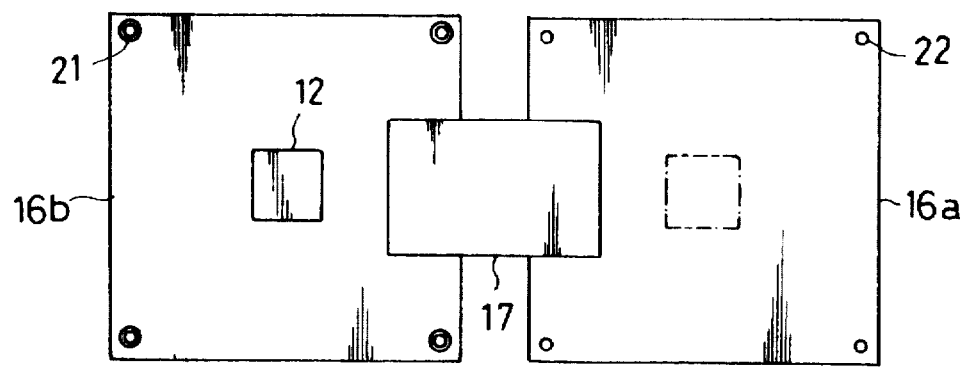
FIG. 6 is a plan view showing a semiconductor element fixed to one of the package bases.
Figure 7:
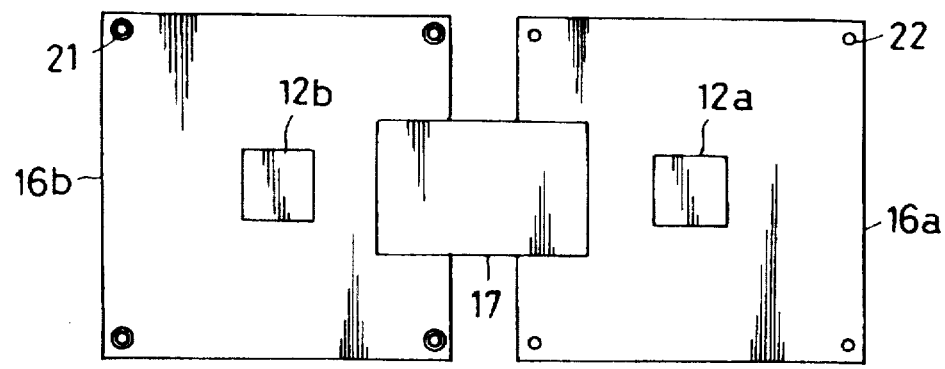
FIG. 7 is a plan view showing semiconductor elements fixed to both of the package bases.

Subsequently, as shown in FIG. 6, the semiconductor element 12b is die-bonded with a conductive epoxy resin on the die pad 19 of the package base 16b. Further, as shown in FIG. 7, the semiconductor element 12a is likewise die-bonded on the die pad 19 of the package base 16a.

Figure 8:
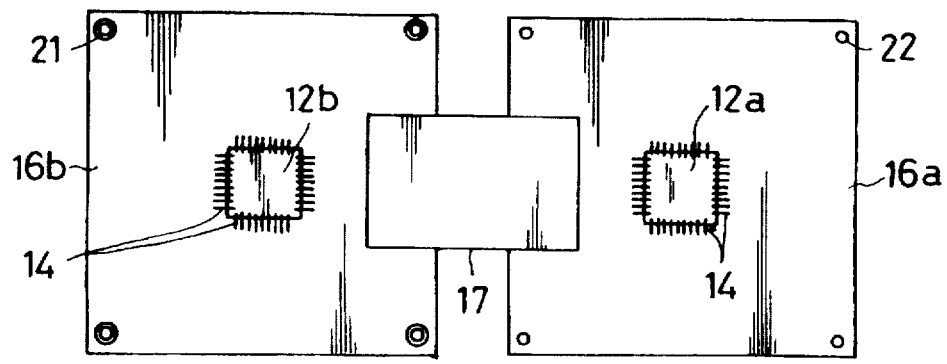
FIG. 8 is a plan view of the semiconductor elements wire-bonded.
Figure 9:
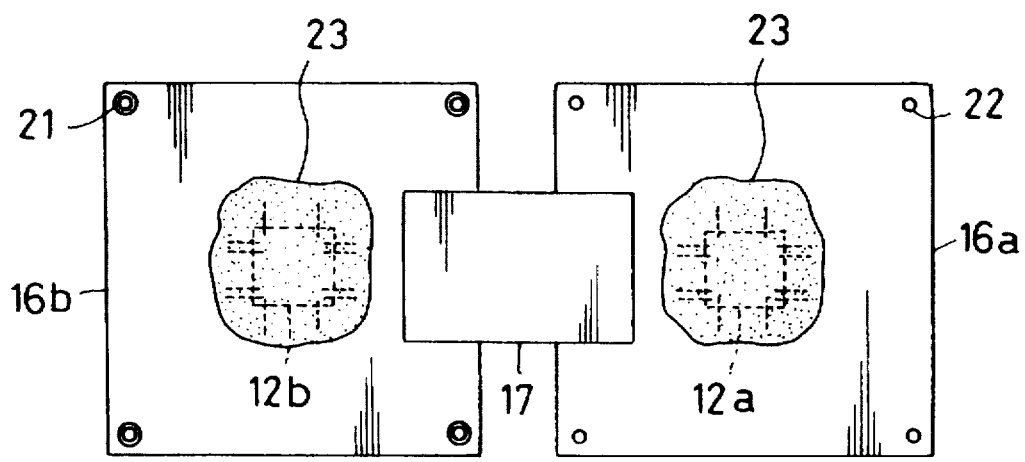
FIG. 9 is a plan view of the semiconductor elements potted with a resin.

Next, as shown in FIG. 8, fine metal lines 14 are formed for wire-bonding between the ends of wiring patterns 15 and bonding pads of the semiconductor element 12b on the package base 16b. The semiconductor element 12a on the package base 16a is wire-bonded similarly. Thereafter, as shown in FIG. 9, protective films 23 are formed by potting an insulating epoxy resin or the like over the semiconductor elements 12a and 12b and fine metal lines 14.

Figure 10A:
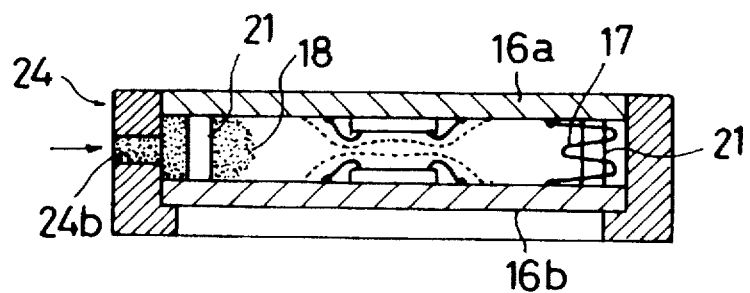
FIGS. 10A and 10B are sectional views showing a process of filling the resin into a space between the package bases.
Figure 10B:
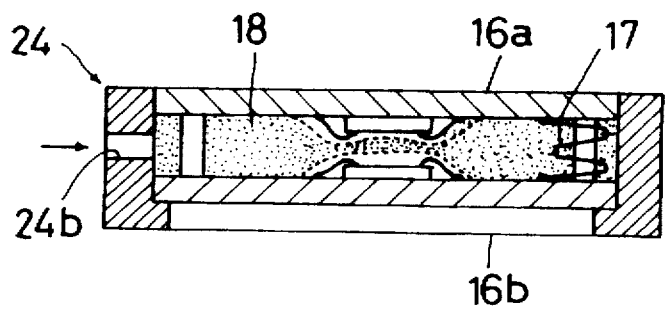
Figure 11:
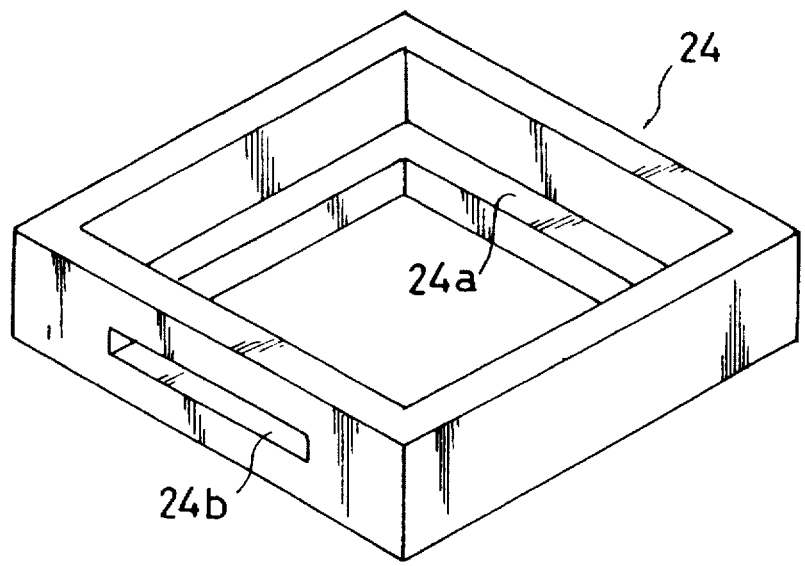
FIG. 11 is a perspective view of a frame used in the resin filling process.

After forming the protective films 23, as shown in FIG. 10A, the two package bases 16a and 16b are assembled to extend parallel to each other as vertically spaced by the pins 21, with the holes 22 at the four corners of the package base 16b fitted on the projections 21a of the pins 21 on the package base 16b. The assembly is placed in a square frame 24 for use in resin injection. As shown in FIG. 11, the frame 24 is vertically open, and has a supporting shoulder 24a formed around a lower inner surface thereof. One side of the frame 24 is perforated to define a resin inlet 24b. The two package bases 16a and 16b are placed in the frame 24, with the package base 16b supported at peripheries thereof by the supporting shoulder 24a. As shown in FIG. 10B, the space between the package bases 16a and 16b is filled with the insulating epoxy resin 18 introduced through the resin inlet 24b. Finally, the package 11 is removed from the frame 24 to obtain the semiconductor device 10 shown in FIG. 3.

Next, the method of electrically connecting semiconductor devices as shown in FIG. 3 and the connectors used therein will be described.

Figure 16:
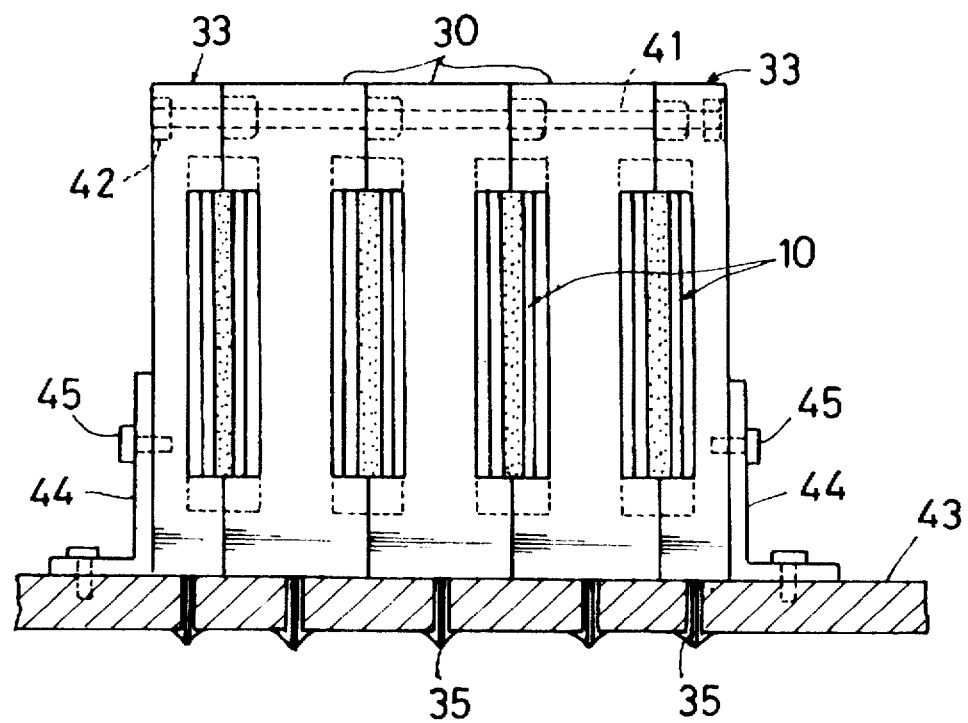
FIG. 16 is a front view, partly in section, of the semiconductor devices mounted on a carrier board by means of the connectors.
Figure 12:
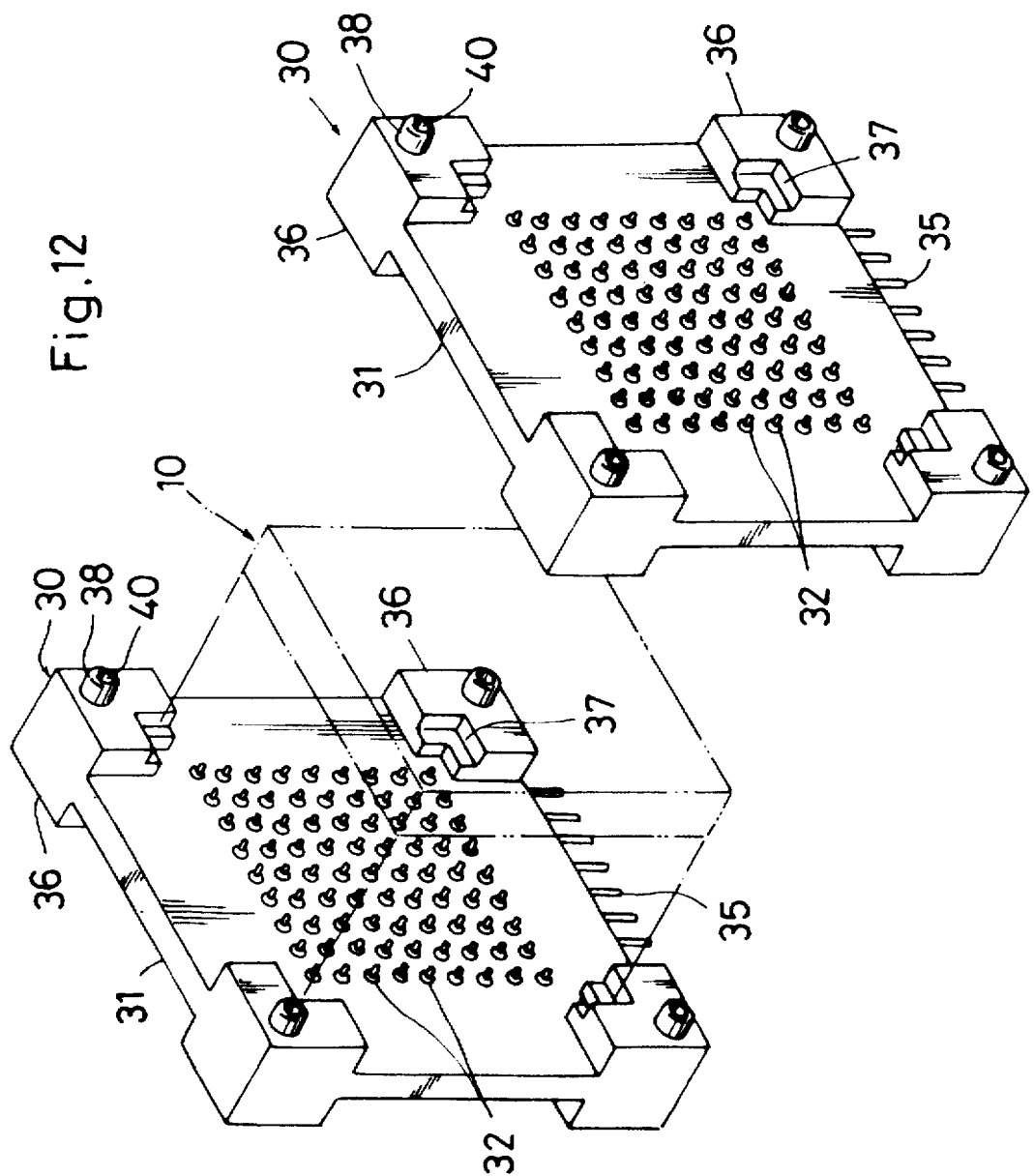
FIG. 12 is a perspective view of connectors embodying this invention.
Figure 13:
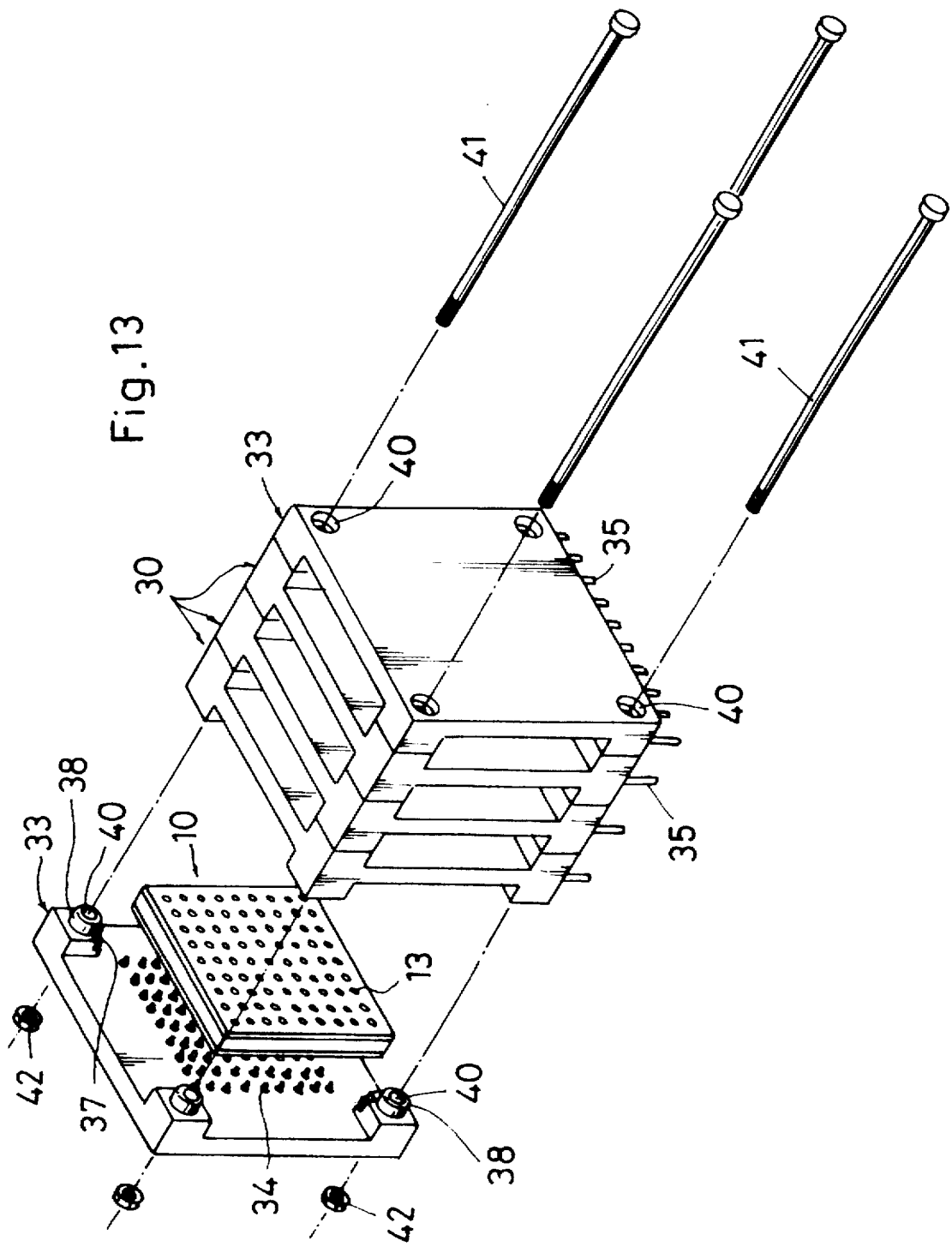
FIG. 13 is a perspective view showing a way in which semiconductor devices are assembled with the connectors.
Figure 14:
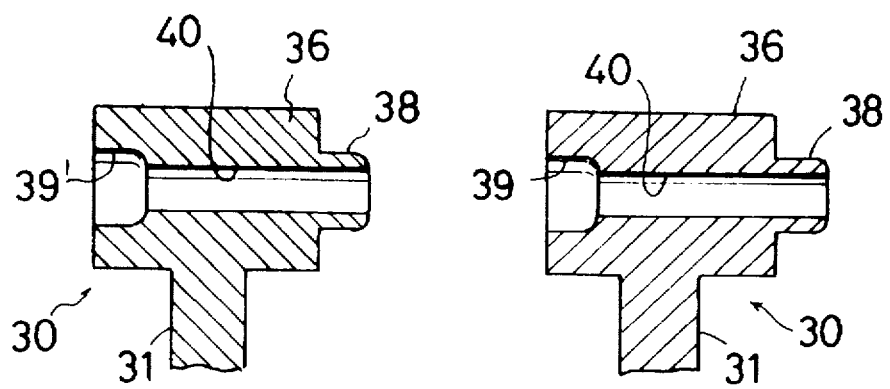
FIG. 14 is a fragmentary sectional view showing a connector coupling structure.
Figure 15:
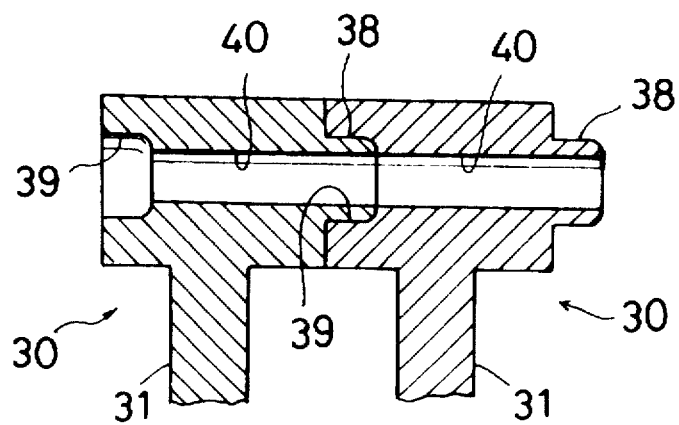
FIG. 15 is a fragmentary section view of the connectors in a coupled state.

FIG. 12 is a perspective view of the connectors embodying this invention. FIG. 13 is an exploded perspective view showing use of the connectors. FIGS. 14 and 15 are fragmentary sectional views showing a connector coupling structure. FIG. 16 is a front view, partly in section, of the semiconductor devices mounted on a carrier board.

As shown in FIG. 12, each connector 30 includes a rectangular base plate 31, and a plurality of connecting pins 32 extending through the base plate 31 to project from opposite surfaces thereof. The base plate 31 is formed of an insulating synthetic resin. From the viewpoint of enhanced heat radiation of the connector 30, the base plate 31 may be formed of aluminum and covered with an insulating film. The connecting pins 32 are elastic axially thereof. Details of the connecting pins 32 will be described later. The connecting pins 32 are arranged two-dimensionally at the intervals corresponding to those of the exposed terminals 13 of the semiconductor device 10. When the semiconductor device 10 is sandwiched between two connectors 30, the connecting pins 32 of the respective connectors 30 press on the exposed terminals 13 on the opposite surfaces of the semiconductor device 10. These connecting pins 32 correspond to the conductive connecting elements of this invention.

As shown in FIG. 13, such connectors 30 may be interposed between a plurality of semiconductor devices 10 to realize a high-density package of semiconductor devices 10 (four devices in FIG. 13). The connecting pins 32 project from the opposite surfaces of each of the three intermediate connectors 30 shown in FIG. 13, since each is flanked by semiconductor devices 10. Each end connector 33, on the other hand, has connecting pins 34 projecting from only an inward surface thereof since only the inward surface is opposed to one of the semiconductor devices 10. Of course, the connectors 30 having the connecting pins 32 projecting from the opposite surfaces thereof may be used at the ends.

A plurality of terminals 35 for external connection extend from a lower surface of the base plate 31 of each connector 30 or 33. These terminals 35 are electrically connected to wiring patterns formed on a carrier board when a plurality of semiconductor devices 10 are mounted on the carrier board by means of the connectors 30 and 33. The terminals 35 are electrically connected to appropriate connecting pins 32. A specific construction of terminals 35 will be described later.

The base plate 31 of each connector 30 has a positioning structure for positioning the semiconductor devices 10 such that the exposed terminals 13 of the semiconductor devices 10 register with the connecting pins 32 of the connector 30. Specifically, the positioning structure is in the form of square blocks 36 formed at the four corners of the base plate 31, with a stepped cutout 37 formed in an inward corner of each block 36. The corners of each semiconductor device 10 are fitted into the cutouts 37 to place the exposed terminals 13 in register with the connecting pins 32. Similar cutouts 37 are formed in each end connector 33 also.

The base plate 31 of each connector 30 has a coupling structure for rigidly coupling a plurality of connectors 30 in the direction of their thickness, with semiconductor devices 10 sandwiched therebetween. Specifically, as shown in FIG. 14, each of the four square blocks 36 has a projection 38 formed on one surface thereof, and a recess 39 formed on the opposite surface for receiving the projection 38 of an adjacent connector 30. The projection 38 and recess 39 are penetrated by a bore 40. Similar projections 38, recesses 39 and bores 40 are formed on each end connector 33 also.

As shown in FIG. 15, a plurality of connectors 30 and 33 are coupled with the semiconductor devices 10 sandwiched therebetween, by fitting the projections 38 of one connector 30 into the recesses 39 of an opposed one of the connectors 30. After the connectors 30 and 33 are coupled, as shown in FIG. 13, bolts 41 are passed through the four bores 40 of each connector 30 or 33, and nuts 42 are screwed thereon to tighten the connectors 30 and 33 together. In the example shown in FIG. 13, four semiconductor devices 10 are connected. The number of semiconductor devices 10 may of course be varied.

The connectors 30 and 33 assembled to form a three-dimensional unit with a plurality of semiconductor devices 10 sandwiched therebetween are mounted on a carrier board 43 as shown in FIG. 16. Specifically, the connectors 30 and 33 integrated are fixed to the carrier board 43 by means of L-shaped metal fittings 44 and screws 45, with the external connection terminals 35 soldered to wiring patterns on the carrier board 43. Of course, this mode of mounting to the carrier board 43 is not limitative. For example, the connectors 30 and 33 integrated may be stacked one over the other on the carrier board 43.

The connecting pins 32 arranged two-dimensionally on each connector 30 will be described next with reference to FIGS. 17 through 20.

Figure 17:
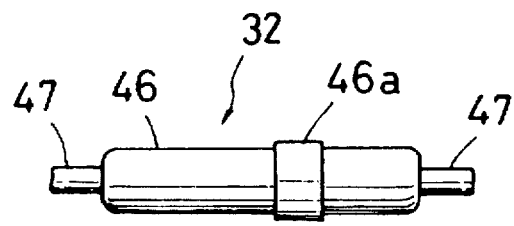
FIG. 17 is a front view of a connecting pin.
Figure 18:
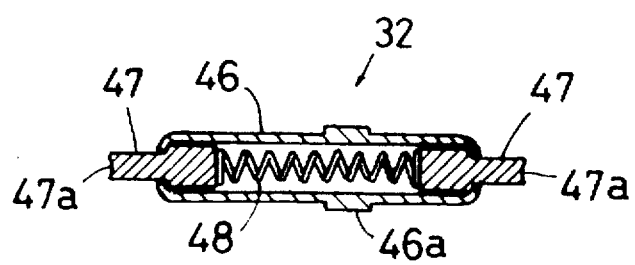
FIG. 18 is a sectional view of the connecting pin shown in FIG. 17.

As shown in FIGS. 17 and 18, each connecting pin 32 has a conductive tube 46 opening at opposite ends thereof, and conductive contacts 47 mounted in the tube 46 to be movable longitudinally thereof. The tube 46 contains a coil spring 48 for outwardly biasing the contacts 47. Under the biasing force of the spring 48, distal ends of the respective contacts 47 project from the end openings of the tube 46. The contacts 47 have large diameter proximal ends to prevent the contacts 47 from falling off the tube 46. These contacts 47 of each connecting pin 32 are electrically interconnected through the conductive tube 46 and coil spring 48.

The tube 46 of each connecting pin 32 is about 3 to 5 mm long, and about 0.6 to 0.7 mm in outside diameter. Each contact 47 is about 0.2 to 0.3 mm in diameter. The length of the distal end of each contact 47 projecting from the opening of the tube 46, i.e. a range of movement (or stroke) of each contact 47, is about 0.6 to 0.8 mm. With this relatively large range of movement, the contacts 47 may reliably be pressed into contact with the exposed terminals 13 formed on the semiconductor devices 10 even if variations should occur in the height of exposed terminals 13.

Figure 20A:
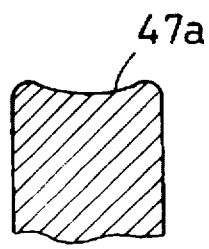
FIGS. 20A through 20C are sectional views showing varied shapes of an end of the connecting pin.
Figure 20B:
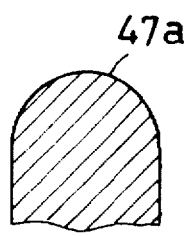
Figure 20C:
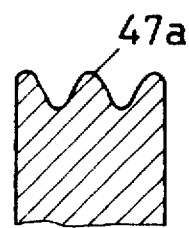

As shown in FIG. 20A, each contact 47 defines a centrally recessed end surface 47a. This shape is selected in order to increase a pressure of elastic contact between the end surface 47a of the contact 47 and one of the exposed terminals 13 formed on semiconductor device 10, to assure an electrical connection therebetween. Other desirable shapes of the end surface 47a of each contact 47 are spherical as shown in FIG. 20B, and jagged as shown in FIG. 20C.

Figure 19:
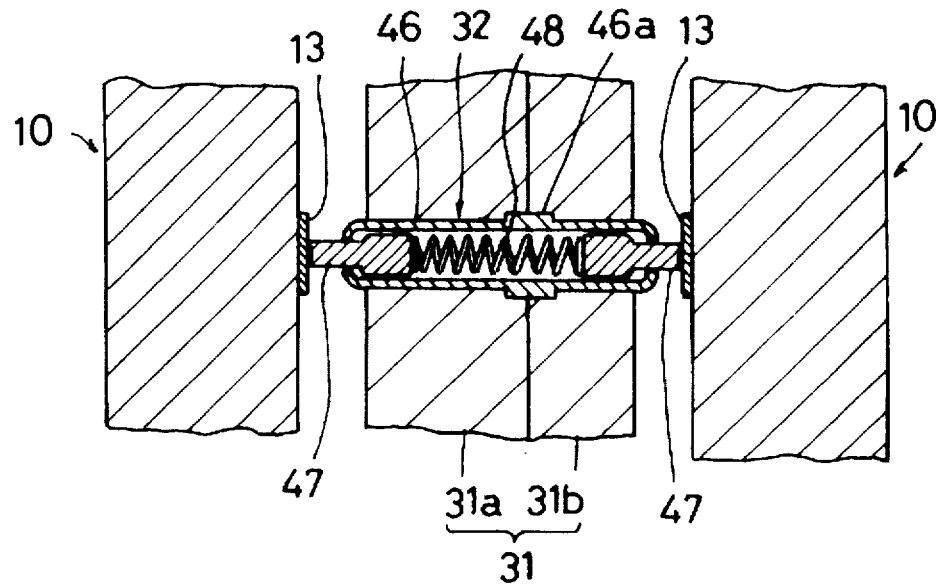
FIG. 19 is a sectional view showing a structure for mounting a connecting pin.

FIG. 19 shows a structure for mounting each connecting pin 32 in the base plate 31 of the connector 30.

As seen in FIG. 19, the base plate 31 is formed of two plate members 31a and 31b joined together. Before joining the plate members 31a and 31b, bores are formed therein for receiving the connecting pins 32. The bores are slightly enlarged at openings thereof in opposed mating surfaces of the two plate members 31a and 31b to define stepped structures for fitting with a flange 46a formed on the tube 46 of each connecting pin 32. One end of each connecting pin 32 is inserted into one of the bores of one plate member 31a, and then the other plate member 31b is placed thereon with the other end of the connecting pin 32 extending into one of the bores thereof. An appropriate adhesive is applied to the mating surfaces of the plate members 31a and 31b, to obtain the integrated base plate 31 with the connecting pins 32 fixed in place by the plate members 31a and 31b.

Figure 21:
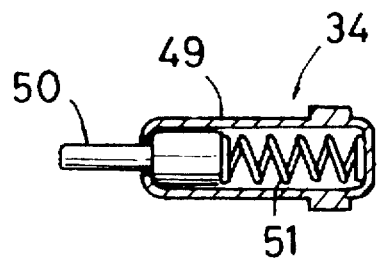
FIG. 21 is a sectional view of a connecting pin of an end connector.

FIG. 21 shows a connecting pin 34 of each end connector 33.

Such connecting pins 34 are attached to only one surface of each end connector 33. Thus, each connecting pin 34 has a bottomed tube 49 opening only at one end thereof, and one contact 50 axially movably mounted therein. The tube 49 contains a coil spring 51 for biasing the contact 50, so that a distal end of the contact 50 projects from the opening of the tube 49. As is the connecting pin 32 shown in FIG. 19, the connecting pin 34 also is secured to the base plate 31 formed of two plate members joined together. However, in the case of each end connector 33, bores are formed only in the inner plate member for receiving the connecting pins 34.

Connection structures between the terminals 35 for external connection and connecting pins 32 and 34 will be described with reference to FIGS. 22 and 23.

Figure 22:
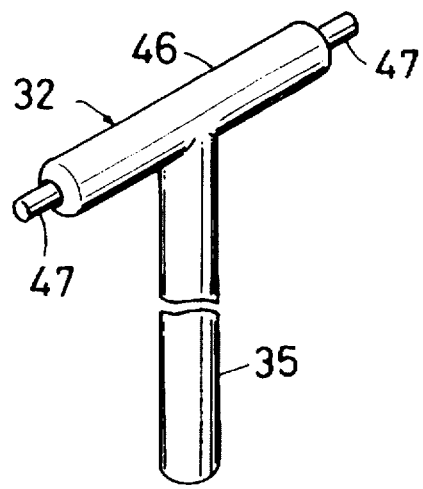
FIG. 22 is a perspective view showing a connection between a connecting pin and an external connection terminal.
Figure 23:
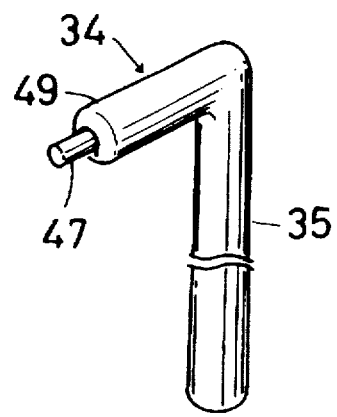
FIG. 23 is a perspective view showing a connection between a connecting pin of an end connector and an external connection terminal.

In the case of connector 30, as shown in FIG. 22, the terminals 35 for external connection are connected, such as by welding, to the tubes 46 of the connecting pins 32 beforehand, which are to form a lowermost array in the base plate 31. Such integrated connecting pins 32 and terminals 35 are assembled to the base plate 31. Similarly, in the case of end connector 33, as shown in FIG. 23, the terminals 35 for external connection are connected to the tubes 49 of the connecting pins 34 beforehand, which are to form a lowermost array in the base plate 31. Such integrated connecting pins 34 and terminals 35 are assembled to the base plate 31.

The connection structures between the terminals 35 for external connection and connecting pins 32 and 34 are not limited to the above example. In another example, through hole plating is applied to the bore of at least one of the plate members 31a and 31b constituting the base plate 31 as described with reference to FIG. 19. Printed circuit patterns are formed on the mating surface of plate member 31a or 31b. One end of each printed circuit pattern is connected to the through hole plating, with the other end of the circuit pattern extending toward the terminal 35. The other end is connected, such as by soldering, to one of the terminals 35. With this construction, the connecting pins 32 and 34 regardless of their positions in the two-dimensional arrangement may be electrically connected to the terminals 35 for external connection.

By using the above connectors 30 and 33 in connecting a plurality of semiconductor devices 10, the exposed terminals 13 of an adjacent pair of semiconductor devices 10 are interconnected through the connecting pins 32 or 34. These connecting pins 32 and 34 are extremely short (about 4 to 6 mm) to minimize stray capacitance and parasitic inductance. A plurality of semiconductor devices 10 arranged in an opposed relationship readily realize a high-density packaging. The connectors 30 and 33 are disconnectable simply by removing the coupling bolts 41 shown in FIGS. 13 and 16. Thus, when one of the semiconductor devices 10 should fail, the defective device 10 may be replaced and repackaged with ease.

Figure 24:
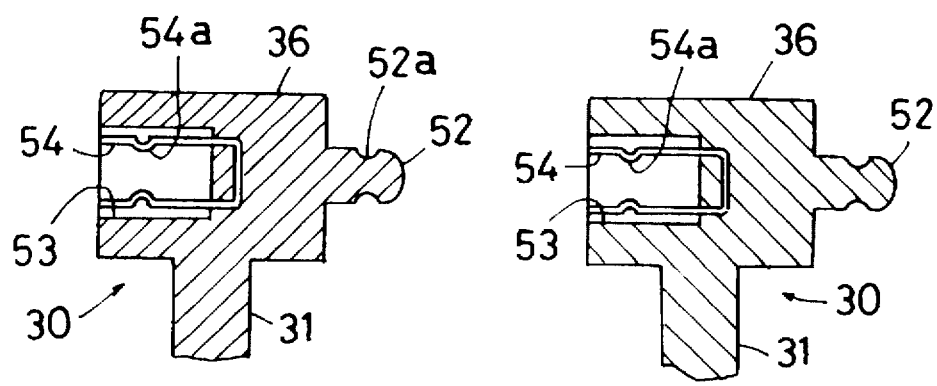
FIG. 24 is a fragmentary sectional view showing a modified connector coupling structure.
Figure 25:
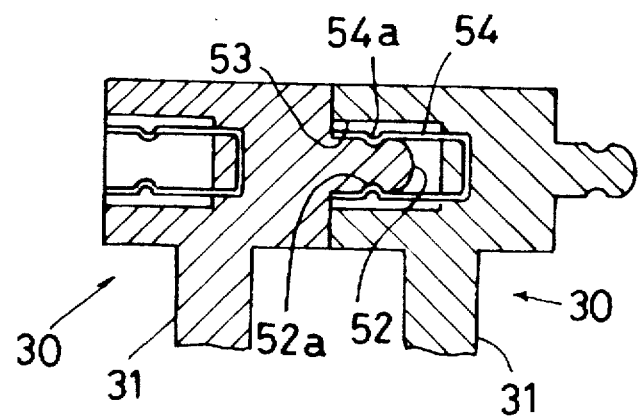
FIG. 25 is a fragmentary section view of the connectors of FIG. 24 in a coupled state.

This invention is not limited to the foregoing embodiment, but may be modified as follows:

(1) In the foregoing embodiment, bolts and nuts are used to couple a plurality of connectors 30 and 33 together. A coupling structure as shown in FIG. 24 may be employed instead. In this example, each connector 30 has a projection 52 on one surface of each corner block 36. The other surface of each corner block 36 defines a hole 53 accommodating a leaf spring 54 in a tubular form. When the projection 52 of one connector 30 is inserted into the hole 53 of another connector 30, as shown in FIG. 25, a groove 52a of the projection 52 fits with a ridge 54a of the leaf spring 54, thereby coupling the two connectors 30.

Figure 26:
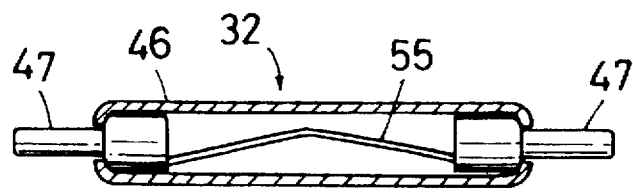
FIG. 26 is a sectional view of another example of connecting pins.

(2) In the foregoing embodiment, each connecting pin 32 has a pair of contacts 47 biased by a coil spring 48 mounted in a tube 46. Instead, the contacts 47 may be biased by a leaf spring 55 as shown in FIG. 26.

Figure 27:
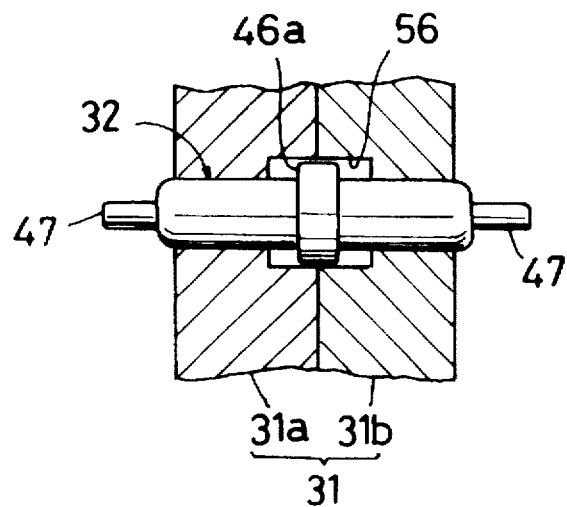
FIG. 27 is a sectional view showing a modified structure for mounting a connecting pin.

(3) As shown in FIG. 27, the plate members 31a and 31b of the base plate 31 may have stepped openings 56 formed in the mating surfaces thereof to be slightly longer than the flange 46a of the connecting pin 32, whereby the entire connecting pin 32 is axially displaceable. With this construction, the connecting pins 32 contacting the exposed terminals 13 of the semiconductor devices 10 are axially displaceable to follow large variations, if any, in the height of the exposed terminals 13 exceeding the stroke of the contacts 47. Consequently, the exposed terminals 13 and connecting pins 32 contact each other with increased reliability.

Figure 28:
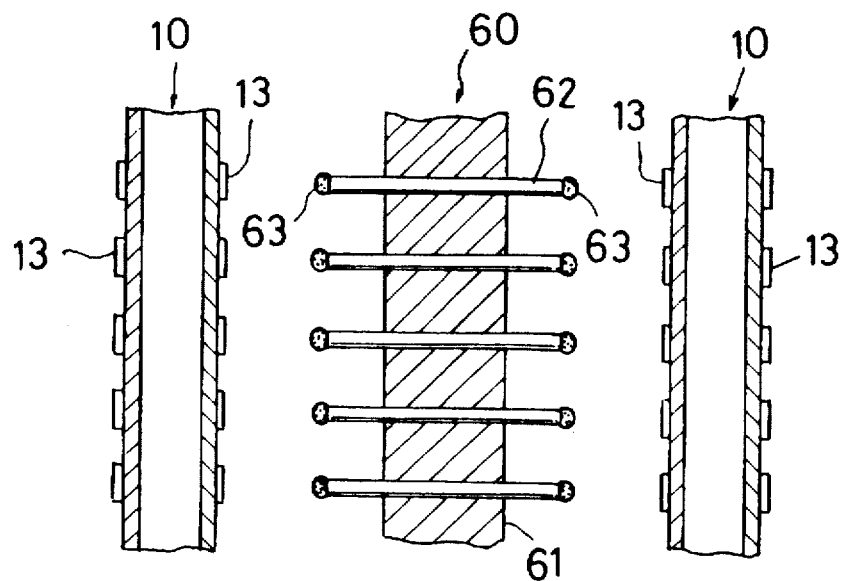
FIG. 28 is a sectional view of a modified connector.
Figure 29:
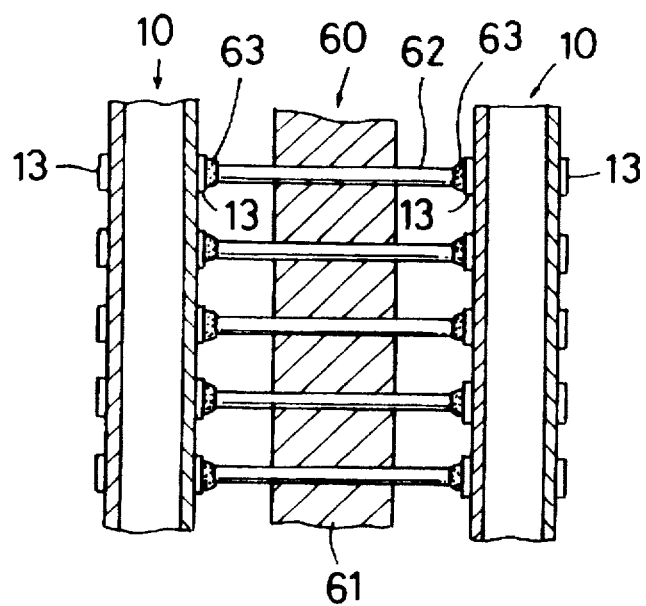
FIG. 29 is a sectional view of the connector of FIG. 28 connected to semiconductor devices.

(4) The foregoing embodiment has been described as having axially elastic connecting pins 32 and 34 acting as conductive connecting elements arranged two-dimensionally on the base plate of the connectors. However, the conductive connecting elements are not limited to such pins. FIG. 28 shows a different example. A connector 60 in this example includes a base plate 61 having a two-dimensional arrangement of connecting pins 62 in the form of rod-shaped metal elements. Each connecting pin 62 has solder balls 63 formed at opposite ends thereof. The solder balls may be formed with ease by electroplating carried out after forming an insulating film on a shank portion, excluding the opposite ends, of the connecting pin 62. The aspects other than the connecting pins 62 are the same as in the connectors 30 and 33 described hereinbefore. The connectors 60 are connected to the semiconductor devices 10 by what is known as a reflow process. That is, as shown in FIG. 29, the connecting pins 62 of each connector 60 placed in contact with the exposed terminals 13 of the semiconductor devices 10 are heated, whereby the solder balls 63 are fused to join the exposed terminals 13 and connecting pins 62. The connectors 60 in this example have a relatively simple construction and may be manufactured at low cost. The exposed terminals 13 and connecting pins 62 joined with solder have a reliable electrical connection therebetween.

Figure 30:
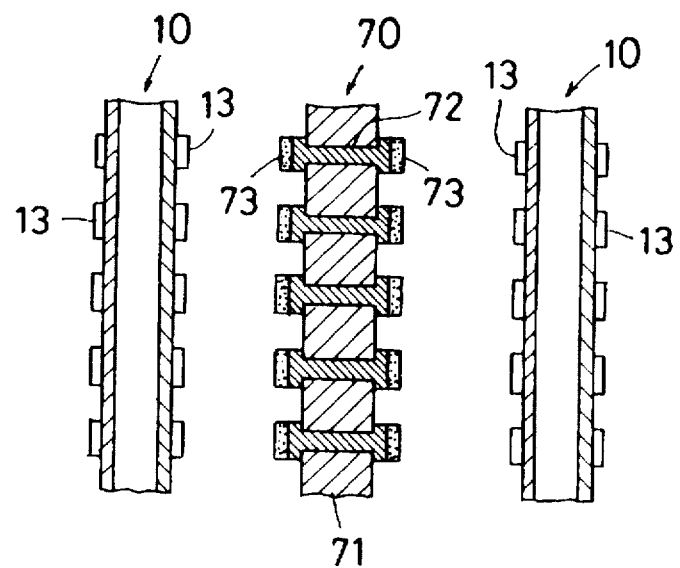
FIG. 30 is a sectional view of a further modified connector.
Figure 31:
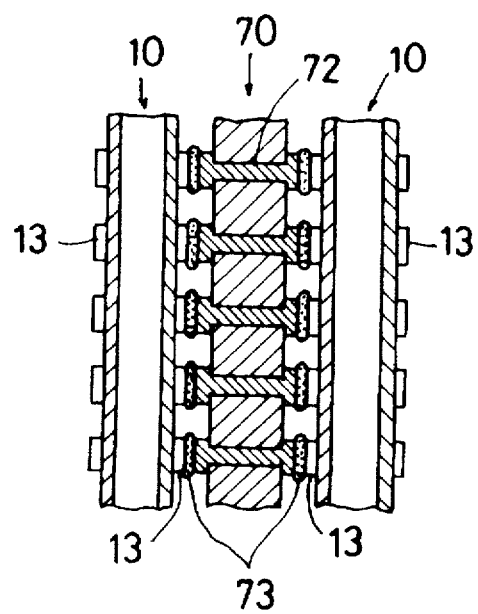
FIG. 31 is a sectional view of the connector of FIG. 30 connected to semiconductor devices.

(5) FIG. 30 shows a further example of conductive connecting elements. Each connector 70 in this example includes a base plate 71 having a two-dimensional arrangement of through hole platings 72. Solders 73 are formed on each through hole plating 72 by electroplating. As is the connector 60 shown in FIG. 28, this connector 70 also is connected to the semiconductor devices 10 by a reflow process. FIG. 31 shows a connected state. The connectors 70 in this example may also be manufactured at low cost, and the exposed terminals 13 and connecting pins 72 are electrically connected with assurance.

The present invention may be embodied in other specific forms without departing from the spirit or essential attributes thereof and, accordingly, reference should be made to the appended claims, rather than to the foregoing specification, as indicating the scope of the invention.

What is claimed is:

1. A semiconductor device having at least one semiconductor element enclosed in a package, comprising:
   package means for enclosing said semiconductor element;
   a plurality of exposed terminals for external connection arranged two-dimensionally on each of opposite surfaces of said package means; and
   internal wiring means for interconnecting said semiconductor element and said exposed terminals for external connection on said opposite surfaces of said package means, wherein said package means includes package bases defining said opposite surfaces thereof, respectively, said exposed terminals for external connection being formed on outer surfaces of said package bases, said semiconductor element being die-bonded to an inner surface of at least one of said package bases and wherein said package bases are electrically interconnected through a flexible printed circuit board defining a plurality of wiring patterns, said wiring patterns being connected at first ends thereof to internal terminals formed on an inner surface of one of said package bases, and at second ends thereof to internal terminals formed on an inner surface of the other of said package bases.

2. A semiconductor device as defined in claim 1, further comprising a sealing synthetic resin filled into a space between said package bases.

3. A method of electrically connecting a plurality of semiconductor devices each having at least one semiconductor element enclosed in a package, a plurality of exposed terminals for external connection arranged two-dimensionally on each of opposite surfaces of the package, and internal wiring for interconnecting the semiconductor element and the exposed terminals for external connection on the opposite surfaces of the package, said method comprising:
   arranging said semiconductor devices at fixed intervals with said exposed terminals of one semiconductor device opposed to said exposed terminals of another semiconductor device; and
   interposing conductive connecting elements between an adjacent pair of said semiconductor devices, to interconnect said exposed terminals of one semiconductor device and said exposed terminals of another semiconductor device, thereby to electrically connect said semiconductor devices, wherein said conductive connecting elements are connecting pins having opposite ends thereof elastically contacting said exposed terminals opposed to each other.

4. A method of electrically connecting a plurality of semiconductor devices each having at least one semiconductor element enclosed in a package, a plurality of exposed terminals for external connection arranged two-dimensionally on each of opposite surfaces of the package, and internal wiring for interconnecting the semiconductor element and the exposed terminals for external connection on the opposite surfaces of the package, said method comprising:
   arranging said semiconductor devices at fixed intervals with said exposed terminals of one semiconductor device opposed to said exposed terminals of another semiconductor device; and
   interposing conductive connecting elements between an adjacent pair of said semiconductor devices, to interconnect said exposed terminals of one semiconductor device and said exposed terminals of another semiconductor device, thereby to electrically connect said semiconductor devices, wherein said conductive connecting elements are connecting pins having opposite ends thereof joined by a joining material to said exposed terminals opposed to each other.

5. A connector assembly for electrically connecting a plurality of semiconductor devices each having at least one semiconductor element enclosed in a package, a plurality of exposed terminals for external connection arranged two-dimensionally on each of opposite surfaces of the package, and internal wiring for interconnecting the semiconductor element and the exposed terminals for external connection on the opposite surfaces of the package, said connector assembly comprising a plurality of connectors each including:
   a base plate; and
   conductive connecting elements arranged two-dimensionally on said base plate in a corresponding relationship to said exposed terminals, said conductive connecting elements extending through said base plate and projecting from opposite surfaces thereof.

6. A connector assembly as defined in claim 5, wherein said base plate includes a positioning structure for positioning said semiconductor devices such that said exposed terminals register with said conductive connecting elements.

7. A connector assembly as defined in claim 5, wherein said base plate includes external connection terminals arranged on at least one side surface thereof.

8. A connector assembly as defined in claim 5, wherein said conductive connecting elements are axially elastic connecting pins having opposite ends thereof elastically contacting said exposed terminals of said semiconductor devices opposed to each other.

9. A connector assembly as defined in claim 8, further comprising a coupling structure for rigidly coupling the base plates arranged in a direction of thickness thereof, with said semiconductor devices interposed therebetween.

10. A connector assembly as defined in claim 8, wherein each of said connecting pins includes:
    a conductive tube opening at opposite ends thereof;
    a pair of conductive contacts disposed in opposite end regions of said tube to be movable longitudinally thereof, said contacts being retained in said tube with only tip ends of said contacts projectable from said opposite ends, respectively; and
    a biasing element mounted in said tube for biasing said contacts in directions to project said tip ends from said opposite ends.

11. A connector assembly as defined in claim 5, wherein said conductive connecting elements are connecting pins in form of metal rods having opposite ends thereof joined through a joining material to said exposed terminals of said semiconductor devices opposed to each other.

12. A connector assembly as defined in claim 11 wherein said connecting pins have solder balls formed at opposite ends thereof.

13. A connector assembly as defined in claim 5, wherein said conductive connecting elements are through hole platings formed by plating a metal in bores of said base plate, said through hole platings having opposite ends thereof joined through a joining material to said exposed terminals of said semiconductor devices opposed to each other.

* * * * *